United States Patent
Hama

[19]

[11] Patent Number: 6,164,982
[45] Date of Patent: Dec. 26, 2000

[54] IC SOCKET FOR HOLDING IC HAVING MULTIPLE PARALLEL PINS

[75] Inventor: Hiroyuki Hama, Tokyo, Japan

[73] Assignee: Advantest Corporation, Tokyo, Japan

[21] Appl. No.: 09/112,286

[22] Filed: Jul. 9, 1998

[51] Int. Cl.$^7$ .................................................. H01R 9/09
[52] U.S. Cl. ............................................ 439/73; 439/489
[58] Field of Search ............................ 439/73, 72, 331, 439/66

[56] References Cited

U.S. PATENT DOCUMENTS

| | | | |
|---|---|---|---|
| 4,396,935 | 8/1983 | Schuck | 357/74 |
| 4,758,176 | 7/1988 | Abe et al. | 439/331 |
| 5,205,756 | 4/1993 | Myers | 439/266 |
| 5,247,250 | 9/1993 | Rios | 324/158 |
| 5,489,854 | 2/1996 | Buck et al. | 439/72 |
| 5,500,605 | 3/1996 | Chang | 324/758 |
| 5,841,640 | 11/1998 | Shibata | 439/73 |
| 5,893,762 | 4/1999 | Kajiwara et al. | 438/72 |

FOREIGN PATENT DOCUMENTS

0 532 925   3/1993   European Pat. Off. .

*Primary Examiner*—Khiem Nguyen
*Assistant Examiner*—J. F. Duverne
*Attorney, Agent, or Firm*—Pillsbury Madison & Sutro LLP

[57] ABSTRACT

An IC socket for holding an IC having multiple parallel lead units and multiple pins each of which includes a tip unit that is bent with respect to the lead unit is equipped with a contact pin for contacting the lead units and a pressing unit for pressing the lead units onto the contact pin. The tip unit may have a soldering unit to be soldered to an object part. The pressing unit is installed at a position that faces the contact pin. The lead units are installed between the pressing unit and the contact pin. The contact pin has elasticity against a direction in which the pressing unit presses the lead units. In order for the contact pin to have this elasticity, the contact pin may have a hollow tube, a spring installed inside the tube, and an axis that the spring presses in an extending direction of the spring. The IC further has a conductive support pin, which supports the IC. A detection pin detects that the IC has been properly installed when the detection pin is electrically connected to the support pin. The multiple contact pins may be installed in a staggered arrangement. The IC socket may further have a holding unit for holding the contact pins. The contact pins may protrude out of the holding unit.

23 Claims, 7 Drawing Sheets

IC SOCKET FOR HOLDING IC HAVING MULTIPLE PARALLEL PINS

BACKGROUND OF THE INVENTION

1. Field of the Invention

The present invention relates to an IC socket is adapted to hold an IC. In particular, the present invention relates to an IC socket for holding an IC having multiple parallel pins.

2. Description of Related Art

Conventionally, many kinds of IC sockets have been provided. An IC needs to be easily installed on an IC socket. In addition, the IC socket is required to contact firmly with a terminal of the IC. Furthermore, the IC socket is required to continue to hold the IC firmly even when a load is applied to the IC socket to some extent. The pin pitch of a recent IC tends to become very small. Therefore, an IC socket capable of contacting firmly with such an IC having a very small pin pitch is required. In particular, an IC testing apparatus is required to have an IC socket for holding an IC that firmly contacts each pin of the IC with a high degree of accuracy in order to obtain a highly reliable test result.

SUMMARY OF THE INVENTION

Given these circumstances, it is an object of the present invention to provide an IC socket capable of solving the above-stated problems. The object of the present invention can be achieved by a combination of characteristics described in the independent claims of the present invention. Moreover, the dependent claims of the present invention determine further advantageous aspects of the present invention.

According to a first aspect of the present invention, an IC socket for holding an IC having multiple parallel lead units, multiple pins including tip units that are bent with respect to the lead units, and an IC main body has a contact pin for contacting the lead units and a pressing unit for pressing the lead units onto the contact pin.

According to a second aspect of the present invention, an IC socket for holding an IC having multiple parallel lead units, multiple pins each of which including a soldering unit that is to be soldered to an object part, and an IC main body has a contact pin for contacting the lead units and a pressing unit for pressing the lead units onto the contact pin.

According to a third aspect of the present invention, the pressing unit is installed at a position that faces the contact pin, and the lead units are placed between the pressing unit and the contact pin. In addition, the contact pin has elasticity against a direction in which the pressing unit presses the lead units. In order for the contact pin to have this elasticity, the contact pin may have a hollow tube, a spring installed inside the tube, and an axis that the spring presses in an extending direction of the spring.

According to a fourth aspect of the present invention, the IC socket further has a detection pin for detecting whether the IC has been installed properly. In this case, the IC further has a conductive support pin, which supports the IC, and the detection pin detects that the IC has been properly installed when the detection pin is electrically connected to the support pin.

The plurality of contact pins may be installed in a staggered arrangement. The IC socket may further have a holding unit for holding the contact pins, such that the contact pins protrude out of the holding unit. The height of the protruded portion of each of the contact pins that protrude out of the holding unit may be longer than ½ of the thickness of the IC. The height of the protruded portion of each of the contact pins that protrude out of the holding unit may be longer than the length of the tip unit of each of the contact pins that is measured vertical to the lead unit.

The present invention as described above are suitable particularly for an IC socket that is used for an IC testing apparatus. However, the scope of the present invention is not limited to IC testing apparatuses. For example, the present invention can be applied to a general purpose IC socket that is soldered to a print substrate. Moreover, the above-described summary of the present invention does not list all the essential characteristics of the present invention. Sub-combinations of these characteristics also are covered by the scope of the present invention.

DETAILED DESCRIPTION OF THE INVENTION

In what follows, the present invention will be explained with embodiments of the present invention. However, the following embodiments do not limit the scope of the invention described in the claims. Moreover, not all the combinations of the characteristics described in the embodiments are essential for solving the above problem in the present invention.

Figure 1:
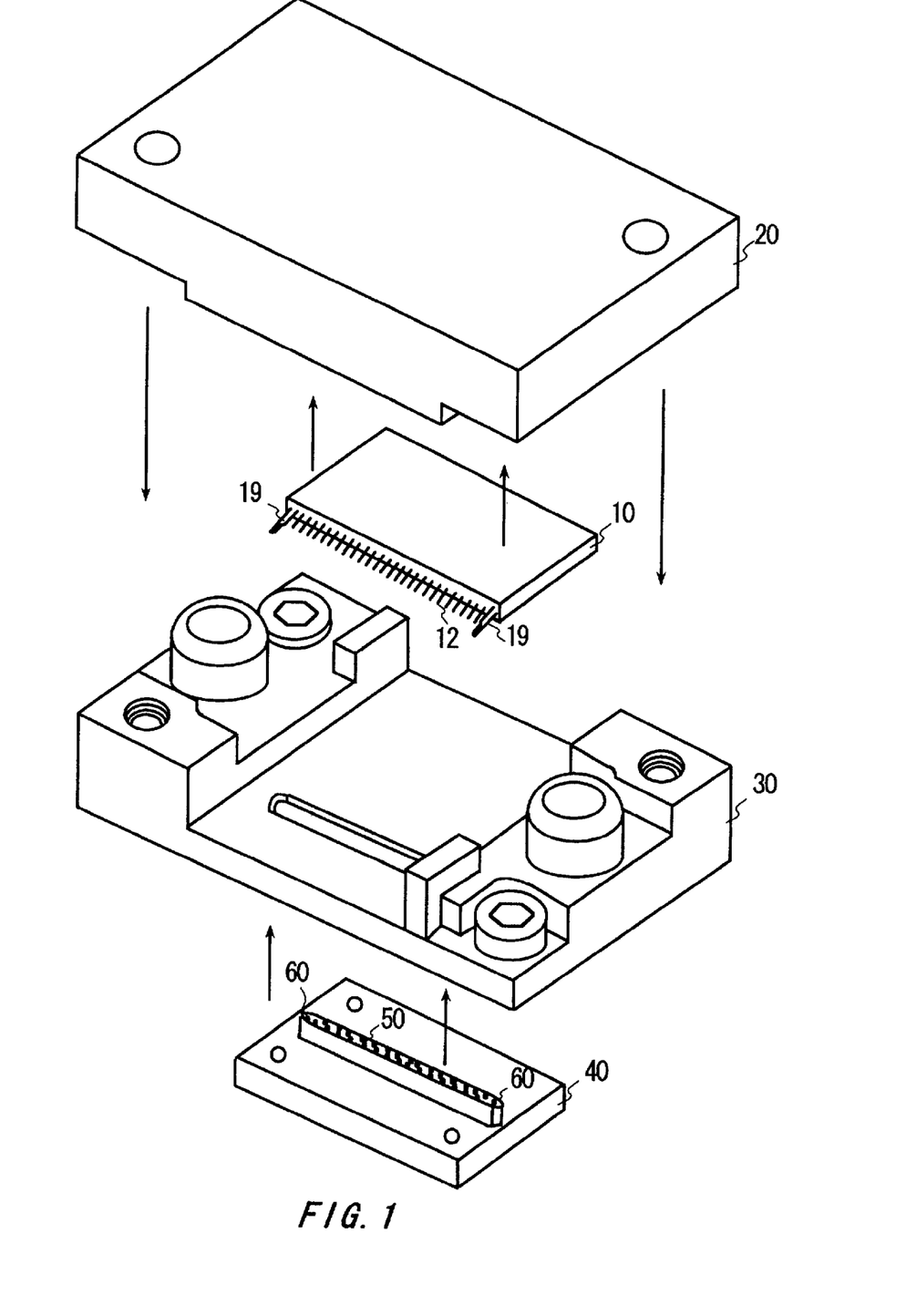
FIG. 1 shows an IC socket according to an embodiment of the present invention.

FIG. 1 shows the way in which an IC socket according to an embodiment of the present invention holds an IC 10. The IC socket according to the present embodiment has a socket cap 20, a socket table 30, and an IC socket main body 40. The IC 10 is first installed in the IC socket cap 20. The socket main body 40 is installed in the socket table 30 from the back of the socket table 30.

The socket main body 40 has multiple contact pins 50 and two detection pins 60. In addition, the IC 10 has multiple IC pins 12 and two support pins 19 for fixing the multiple IC pins 12 and IC 10 onto a circuit substrate or the like. By installing the socket cap 20 on the socket table 30, the contact pins 50 installed on the socket main body contact the IC pins 12 of the IC 10, respectively. At the same time, the two detection pins 60 contact the two support pins 19 of the IC 10, respectively. The two support pins 19 are electrically connected to each other. When the two detection pins 60 contact the two support pins 19, respectively, an electric current flows between the two detection pins 60. In this way, the IC socket can detect that the IC 10 has been installed.

Figure 2:
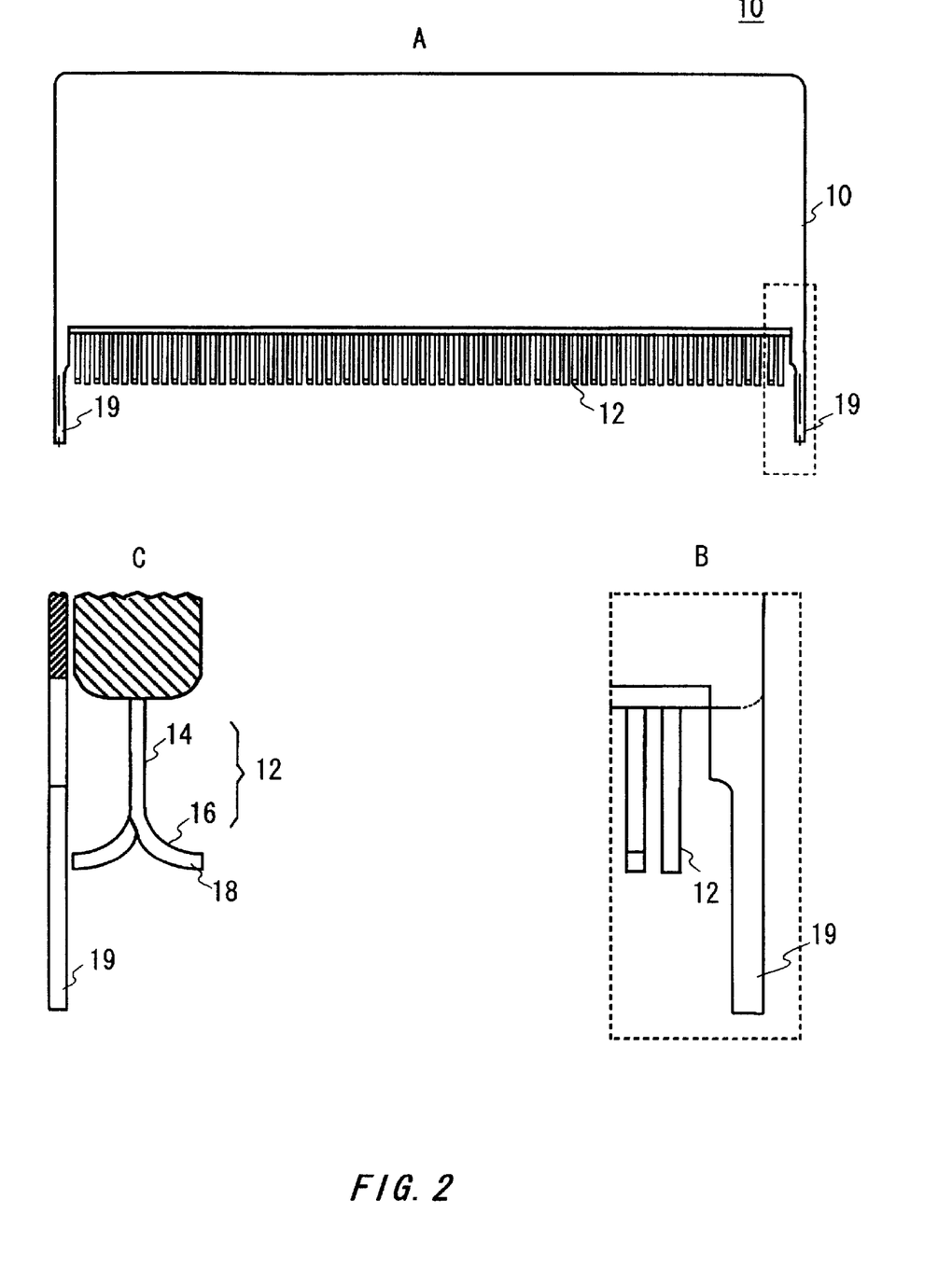
FIGS. 2A through 2C show the IC shown in FIG. 1 in further detail.

FIG. 2A is a top view of the IC 10 shown in FIG. 1. FIG. 2B magnifies a portion of the IC 10 shown in FIG. 1. FIG. 2C shows a cross section of the IC 10 shown in FIG. 1. The multiple parallel IC pins 12, the two support pins 19 for fixing the IC 10 on a circuit substrate or the like are installed on the IC 10. Each of the IC pins 12 has multiple linear lead units 14, which are installed in parallel, and a tip unit 16 that is bent with respect to the lead units 14. Moreover, the tip unit 16 has a soldering unit 18 for soldering the IC 10 with an object part such as a circuit substrate or the like.

Figure 3:
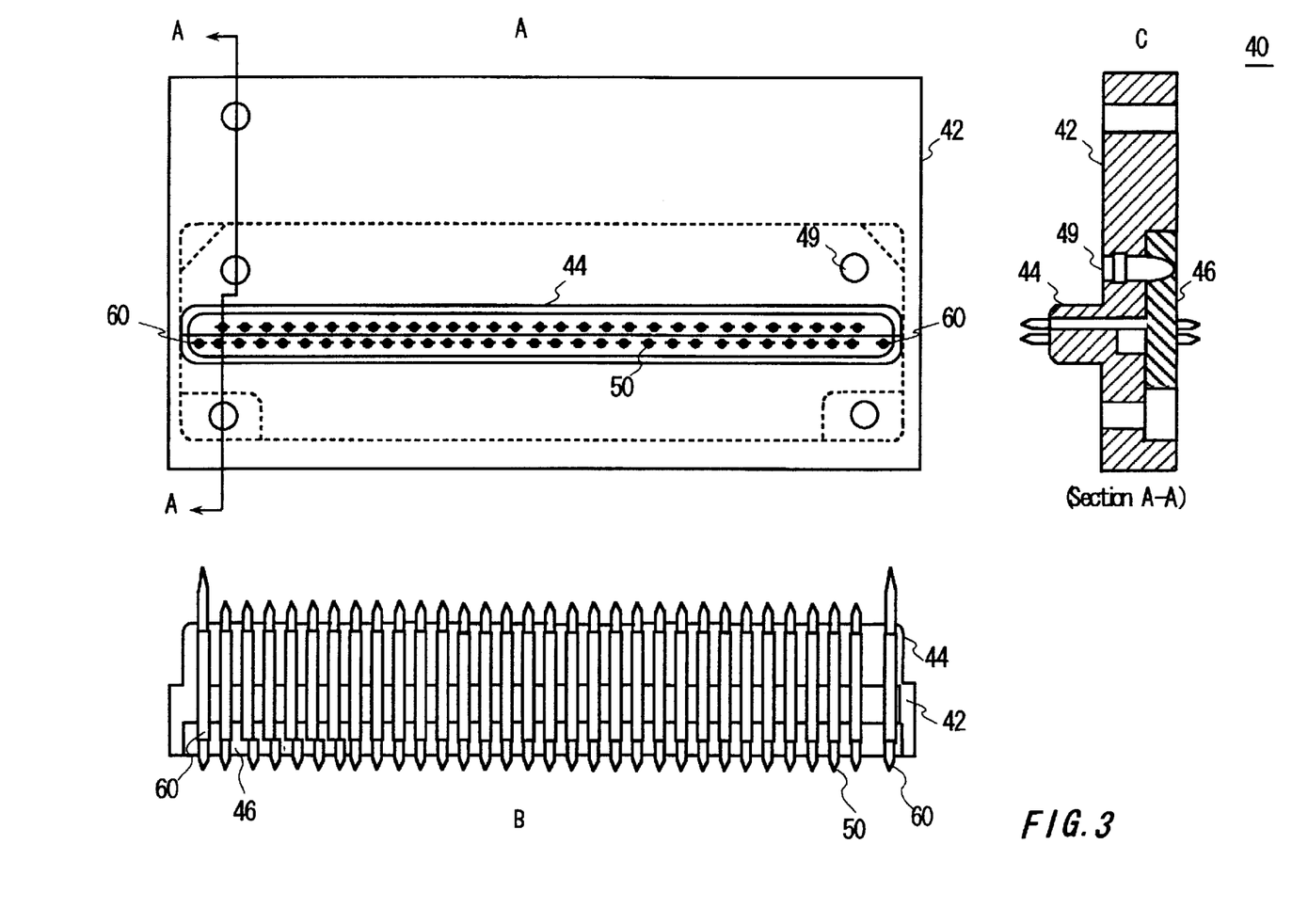
FIGS. 3A through 3C are detailed drawings of the main body of the IC shown in FIG. 1.

FIG. 3A is a top view of the socket main body 40. FIG. 3B is a cross section of the socket main body 40 viewed from the front of the socket main body 40. FIG. 3C is the cross section across the line A—A of the socket main body 40 shown in FIG. 3A viewed from the side of the socket main body 40. The multiple contact pins 50 which contact the lead units 14 of the IC pins 12, respectively, and the two detection pins 60 which detect that the IC 10 is properly installed, are installed in the socket main body 40.

When the detection pins 60 are electrically connected with the support pins 19 of the IC 10, the detection pins 60 detect that the IC 10 has been properly installed. The multiple contact pins 50 are installed in a staggered arrangement in order to prevent the contact pins from touching each other. In addition, the socket main body 40 further has a holding unit 44 for holding the contact pins 50 and detection pins 60. The tips of the contact pins 50 and the tips of the detection pins 60 extend out of the holding unit 44 so as to contact the IC pin 12 of the IC 10 and the support pins 19, respectively.

Figure 4:
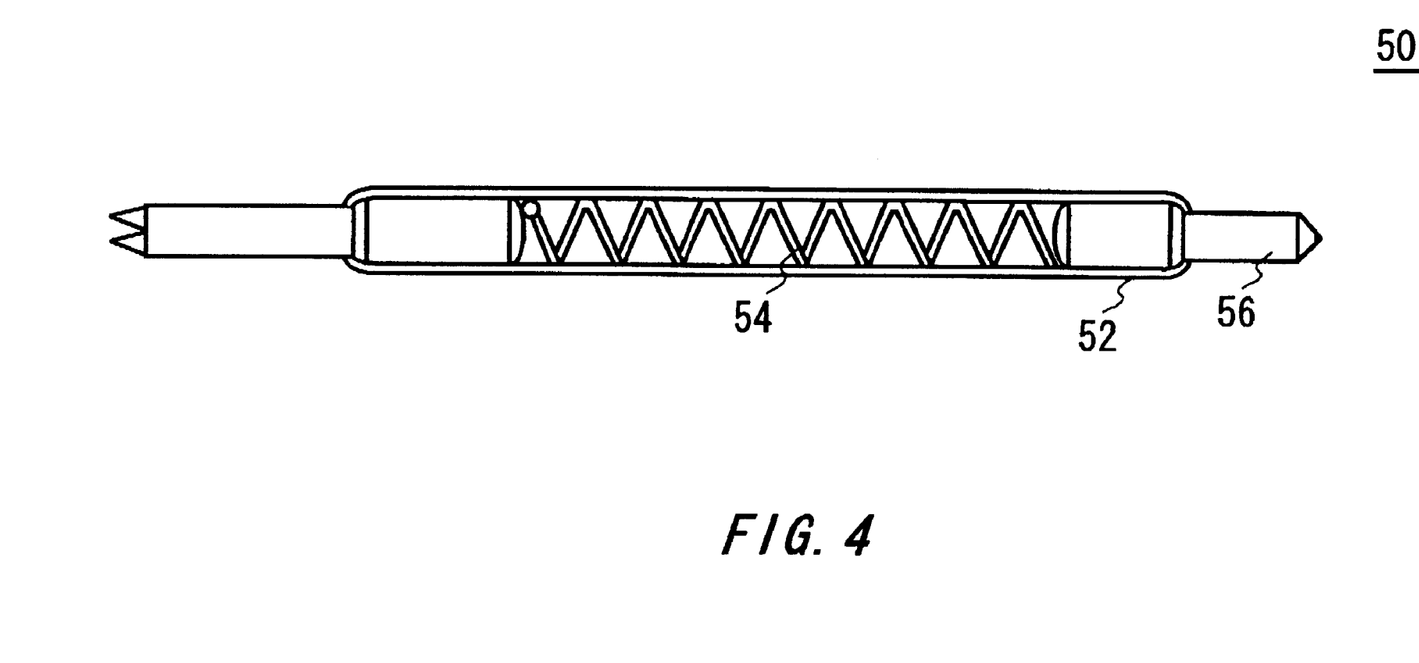
FIG. 4 shows in detail the contact pin shown in FIG. 3.

FIG. 4 shows in detail each of the contact pins 50 shown in FIGS. 5A through 5C. Each of the contact pins 50 has a hollow tube 52, a spring 54 installed inside the tube 52, and an axis 56 that the spring 54 presses in an extending direction of the spring 54. When the IC pin 12 presses down the axis 56 in the axial direction, the spring 54 presses the axis 56 in the direction of the IC pin 12.

Figure 5:
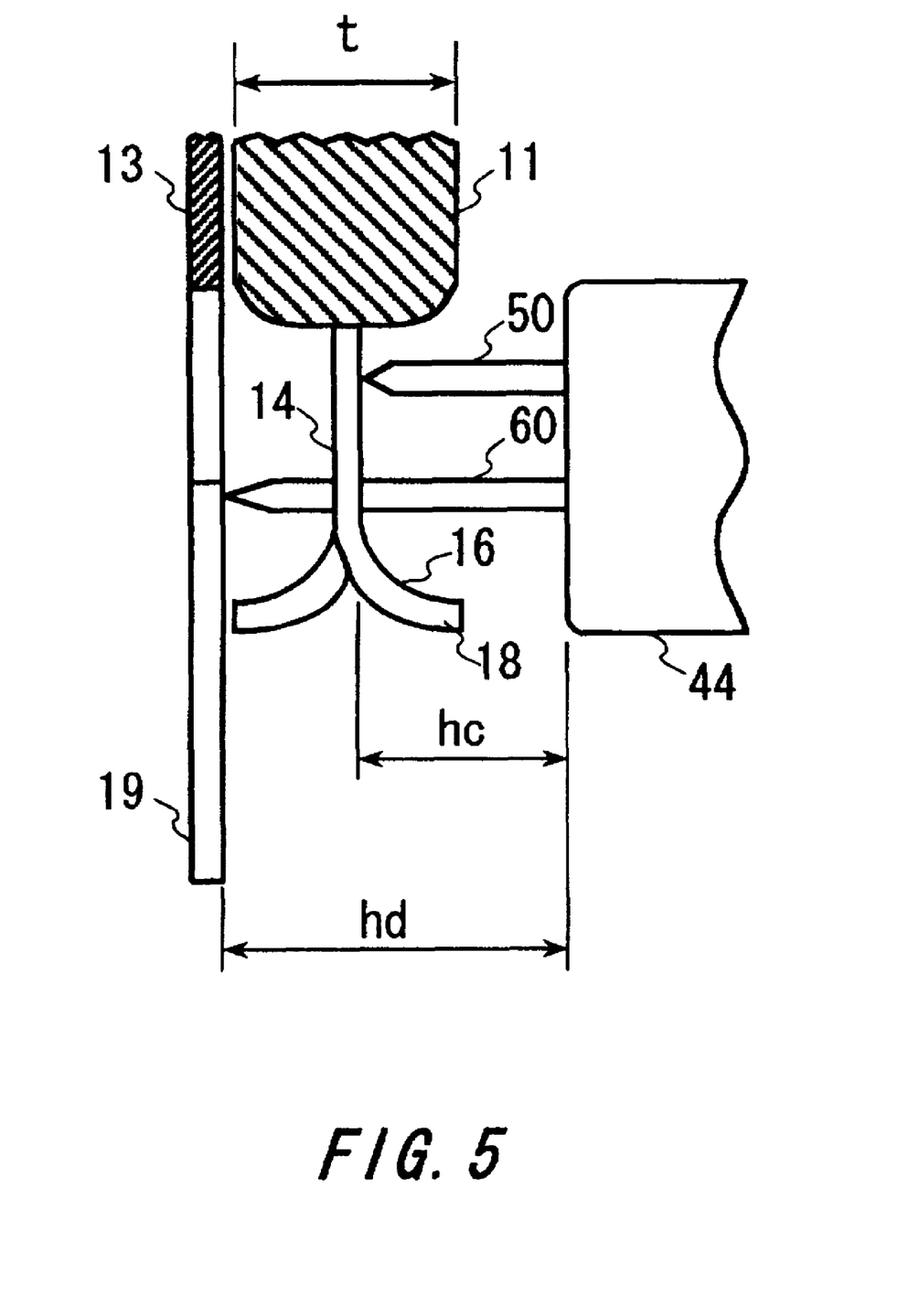
FIG. 5 shows a state in which a contact pin 50 and a detection pin 60 are in contact with a lead unit 14 and a support pin 19 of an IC pin 12, respectively.

FIG. 5 shows a state in which the contact pins 50 and the detection pins 60 contact the lead units 14 of the IC pins 12 and the support pins 19, respectively. In the example shown in FIG. 5, a main body portion 11 of the IC 10 is installed on a support plate 13 that includes the support pins 19. In order to prevent the holding unit 44 installed on the socket main body 40 from contacting the IC 10 when the contact pins 50 press the IC pins 12, it is desirable that the height hc of each of the contact pins 50 that extend out of the holding unit 44 be longer than t/2, where t is the thickness of the main body portion 11.

In addition, in order to prevent the holding unit 44 from contacting the IC pins 12, it is desirable that the height hc of each of the contact pins 50 be longer than the height of the soldering unit 18, which is the tip of the tip unit 16 of the IC pin 12, that is measured vertically with respect to the lead unit 14 in the direction that faces the holding unit 44.

Similarly, in order to prevent the holding unit 44, which is installed on the socket main body 40, from contacting the IC 10 when the detection pins 60 press the support pins 19, it is desirable that the height hd of each of the detection pins 60, which extend out of the holding unit 44, be longer than the thickness t of the main body portion 11.

The contact pins 50 of a conventional IC socket were in contact with the soldering unit 18. In this case, for example, in the IC 10 shown in FIGS. 2A through 2C, it was difficult to press the soldering unit 18 directly onto the contact pins 50 from the top surface of the soldering unit 18. Hence, the entire IC 10 was pressed onto the IC socket from above. Therefore, the conventional IC socket could bend the IC pins 12 when the IC 10 was pressed onto the IC socket. In addition, in order to prevent the IC pins 12 from being bent, the IC 10 had to be very carefully pressed so that the pressing force would not become excessive. As a result, a sufficient level of pressing force could not be applied to the IC pins 12. In particular, when the surfaces of the IC pins 12 were oxidized, the IC socket became insufficiently in contact with the IC 10 in some cases.

The contact pins 50 and the detection pins 60 contact orthogonally the lead unit 14 and the support pins 19, respectively. However, according to the present embodiment, the contact pins 50 contact the lead units 14. As a result, the lead units 14 can be pressed onto the contact pins 50 from the opposite side of the lead units 14. Therefore, it is possible to prevent an excessive amount of bending stress from being generated in the IC pins 12. Moreover, since the support pins 19 are conductive, by bringing the two detecting pins 60 into contact with the two supporting pins 19, respectively, it is possible to judge whether an electric current flows between the two detecting pins 60. In this way, it is possible to detect whether the IC 10 has been properly installed.

Figure 6:
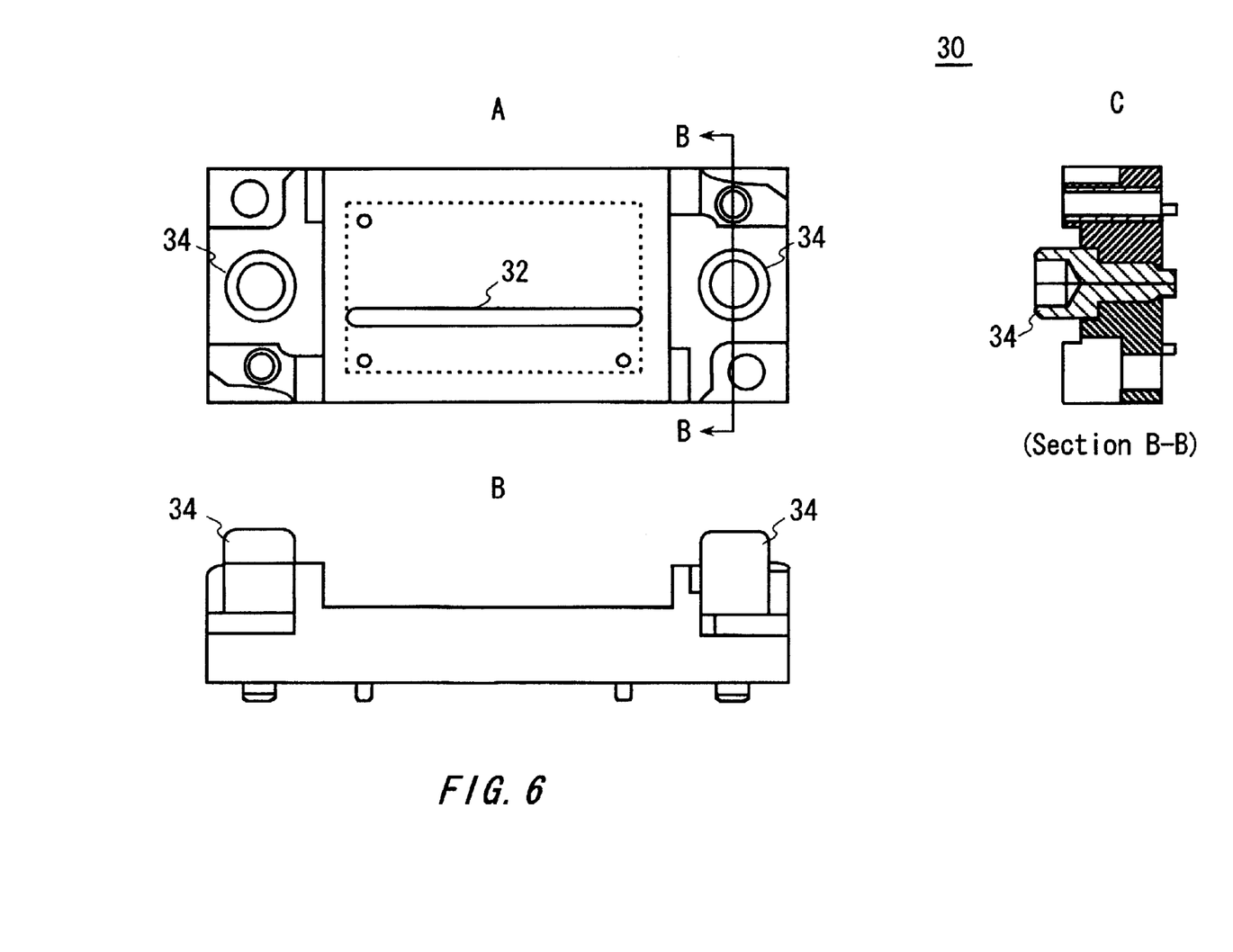
FIGS. 6A through 6C show in detail the socket table shown in FIG. 1.

FIG. 6A is a top view of the socket table 30 shown in FIG. 1. FIG. 6B is a front view of the socket table 30 shown in FIG. 1. FIG. 6C is the cross section across the line B—B of the socket table 30 shown in the top view. The socket table 30 has two convex units 34 for attaching the socket cap 20, and an aperture 32. The socket main body 40 is installed into the aperture 32 from the back of the socket table 30. In this case, the holding unit 44 of the socket main body 40 is inserted into the aperture 32. The contact pins 50 and detection pins 60 are supported by the holding unit 44. As a result, the tips of the contact pins 50 and the tips of the detection pins 60 protrude out of the aperture 32 above the socket table 30, enabling the contact pins 50 and detection pins to contact the IC pins 12 and support pins 19, respectively.

Figure 7:
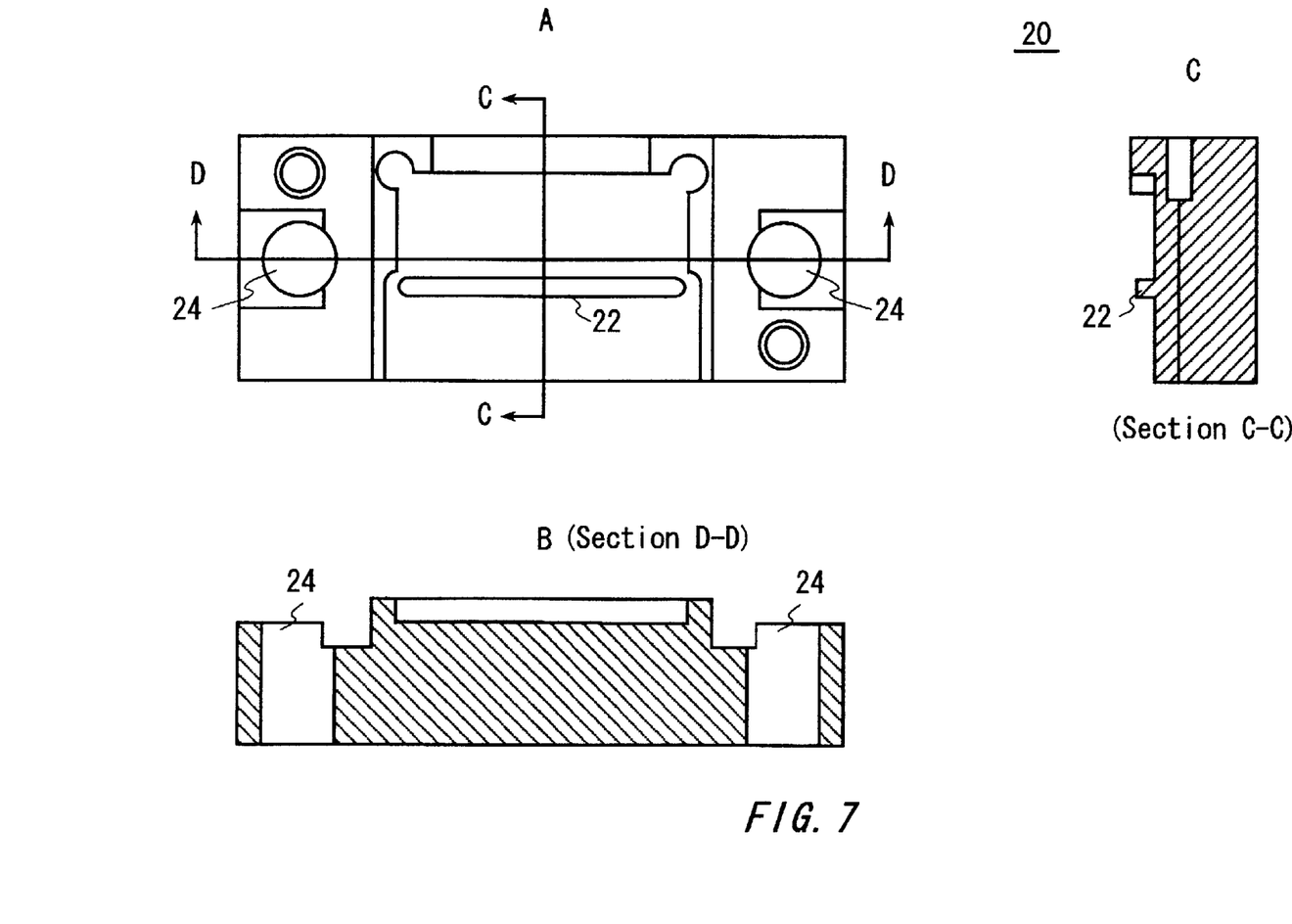
FIGS. 7A through 7C show in detail the cap shown in FIG. 1.

FIG. 7A is a top view of the socket cap 20 shown in FIG. 1. FIG. 7B is the cross section of the socket cap 20 across the line D—D shown in the top view, the cross section being viewed from the front direction. FIG. 7C is the cross section of the socket cap 20 across the line C—C shown in the top view, the cross section being viewed from the side direction. The socket cap 20 has a pressing unit 22 for pressing the lead units 14 of the IC pins 12 onto the contact pins 50, respectively. In addition, the socket cap 20 has two attachment holes 24 into which the two convex units 34 installed on the socket table 30 are inserted.

When the socket cap 20 is installed on the socket table 30, the pressing unit 22 is positioned in front of the contact pins 50 and detection pins 60. At the same time, the lead units 14 of the IC pins 12 are placed between the pressing unit 22 and the contact pins 50. The contact pins 50 have elasticity against the direction in which the pressing unit 22 presses the lead units 14. Therefore, even when the IC pins 12 are bent to some extent, the lead units 14 of the entire IC pins 12 can be brought into firm contact with the contact pins 50.

In the above-described embodiment, the two detection pins 60 contact the two support pins 19 installed on the IC 10. When the two support pins 19 are set to be conductive, this method makes it possible to detect that the IC 10 has been properly installed on the IC socket. However, as another embodiment, it is possible to detect that the IC 10 has been properly installed on the IC socket by having the two detection pins 60 contact only one support pin 19. In addition, when the supporting pins 19 are conductive to a ground pin among the IC pins 12, only one detection pin 60 may be installed. In this case, it is possible to detect whether the IC 10 has been properly installed on the IC socket by detecting whether this detection pin 60 has become conductive to the contact pins 50.

As another embodiment, a single detection pin 60 may be brought into contact with one of the IC pins 12, for example, the ground pin. In this case also, it is possible to detect whether the IC 10 has been properly installed on the IC socket by detecting whether this detection pin 60 has become conductive to the contact pins 50 that has contacted the IC pin. In addition, as yet another embodiment, several of the contact pins 50 may be used as detection pins. For example, when multiple ground pins among the IC pins 12, are conductive to each other, it can be determined whether the IC 10 has been installed properly by detecting whether the contact pins 50 that contact these ground pins have become conductive to each other. More than three detection pins 60 may be installed in order to increase the accuracy for detecting whether the IC 10 has been installed properly.

As is clear from the above explanation, according to the present invention, the IC 10 having multiple parallel pins can be held easily and firmly. Although the present invention has been described using its embodiments, the scope of the present invention is not limited to these embodiments. Those skilled in the art can add various modifications and improvements to the embodiments of the present invention. It is clear from the claims that such modified or improved embodiments can be also covered by the scope of the present invention.

What is claimed is:

1. An IC socket adapted to hold an IC having a main body and a plurality of pins connected to the main body, said pins including parallel lead units that are connected to said main body and tip units that are extending from said parallel lead units and bent with respect to the lead units, said IC socket comprising:

a plurality of contact pins, each constructed and arranged to contact one of said lead units without contacting said tip units; and a pressing unit constructed and arranged to press said lead units onto the contact pins.

2. An IC socket adapted to hold an IC having a main body and a plurality of pins connected to the main body, said IC pins including parallel lead units that are connected to said main body and soldering units that extend from said parallel lead units for being soldered to a circuit substrate, said IC socket comprising:

a plurality of contact pins, each constructed and arranged to contact one of the said lead units without contacting said soldering units; and a pressing unit constructed and arranged to press said lead units onto the contact pin.

3. An IC socket as claimed in claim 1, wherein said pressing unit is installed at a position that faces the contact pins and said lead units are placed between the pressing unit and the contact pins.

4. An IC socket as claimed in claim 2, wherein said pressing unit is installed at a position that faces the contact pins and said lead units are placed between the pressing unit and the contact pins.

5. An IC socket as claimed in claim 1, wherein the contact pin has elasticity in a direction in which the pressing unit presses the lead units.

6. An IC socket as claimed in claim 1, wherein the contact pin has elasticity in a direction in which the pressing unit presses the lead units.

7. An IC socket as claimed in claim 6 wherein the contact pin has:

a hollow tube;

a spring installed inside the hollow tube; and an axis that the spring presses in an extending direction of the spring.

8. An IC socket as claimed in claim 1, further comprising:

a detection pin constructed and arranged to detect whether the IC has been installed on the IC socket properly.

9. An IC socket as claimed in claim 2, further comprising:

a detection pin constructed and arranged to detect whether the IC has been installed on the IC socket properly.

10. An IC socket as claimed in claim 9, wherein the IC pin has a ground pin to be installed at a ground and the detection pin contacts the ground pin when the IC is installed on the IC socket.

11. An IC socket as claimed in claim 9, wherein the IC further has a conductive support pin which supports the IC and the detection pin contacts the support pin when the IC is installed on the IC socket.

12. An IC socket as claimed in claim 11, wherein the IC has a plurality of the detection pins and the plurality of detection pins contact the support pin when the IC is installed on the IC socket.

13. An IC socket as claimed in claim 1, wherein the plurality of contact pins are installed in a staggered arrangement.

14. An IC socket as claimed in claim 2, wherein the plurality of contact pins are installed in a staggered arrangement.

15. An IC socket as claimed in claim 1, further comprising a holding unit for holding the contact pin, wherein the contact pin protrudes out of the holding unit.

16. An IC socket as claimed in claim 2, further comprising a holding unit for holding the contact pin, wherein the contact pin protrudes out of the holding unit.

17. An IC socket as claimed in claim 16, wherein the height of the protruded portion of the contact pin that protrudes out of the holding unit is longer than ½ of the thickness of the IC main body.

18. An IC socket as claimed in claim 16, wherein the height of the protruded portion of the contact pin that protrudes out of the holding unit is longer than a vertical length of the tip unit that is measured vertically with respect to the lead unit.

19. An IC socket as claimed in claim l, further comprising;

a base having a top surface and a bottom surface, said main body of said IC being placed on and contacted to said top surface;

wherein said contact pins protrude from said top surface of said base.

20. An IC socket as claimed in claim 19, further comprising:

an IC socket cap, wherein said main body of said IC is placed between said top surface of said base and said IC socket.

21. An IC socket as claimed in claim 19, further comprising:

a holding unit that holds said contact pins.

22. An IC socket as claimed in claim 20, wherein said base has an opening defined therethrough, and said holding unit is inserted in said opening.

23. An IC socket as claimed in claim 21, further comprising:

a socket main body on which said holding unit is installed, wherein said socket main body is attached on said bottom surface of said base so that said holding unit is inserted through said opening.

* * * * *